United States Patent [19]

Kühn

[11] Patent Number: 4,904,873

[45] Date of Patent: Feb. 27, 1990

[54] METHOD OF PRODUCING AND GUIDING INTENSIVE, LARGE-AREA ION, ELECTRON AND X-RAY BEAMS

[75] Inventor: Werner Kühn, Karlsruhe, Fed. Rep. of Germany

[73] Assignee: Kernforschungszentrum Karlsruhe GmbH, Karlsruhe, Fed. Rep. of Germany

[21] Appl. No.: 315,579

[22] Filed: Feb. 27, 1989

[30] Foreign Application Priority Data

Feb. 26, 1988 [DE] Fed. Rep. of Germany ....... 3806079

[51] Int. Cl.$^4$ ............................................. H01J 37/08
[52] U.S. Cl. ................................. 250/424; 250/423 R;
315/111.81; 313/230; 313/359.1; 313/361.1;
313/363.1; 378/119
[58] Field of Search ............................ 250/423 R, 424;
315/111.81; 313/230, 359.1, 361.1, 363.1;
378/119, 122, 136

[56] References Cited

U.S. PATENT DOCUMENTS 4,721,889 1/1988 Seidel et al. .................... 250/423 R

FOREIGN PATENT DOCUMENTS 1275795 12/1986 U.S.S.R. ......................... 250/423 R

Primary Examiner—Jack I. Berman
Attorney, Agent, or Firm—Spencer & Frank

[57] ABSTRACT

A method for the repeatable generation and guidance of intensive, large-area ion, electron and x-ray beams, with the beam guidance being effected already in the beam generator by means of operationally variable, magnetic and electric fields and variable magnetic correction fields, wherein the beam guidance fields are generated by the beam current itself and the magnetic correction fields by the current source associated with the beam generator.

30 Claims, 7 Drawing Sheets

METHOD OF PRODUCING AND GUIDING INTENSIVE, LARGE-AREA ION, ELECTRON AND X-RAY BEAMS

BACKGROUND OF THE INVENTION

The present invention relates to a method of producing and guiding intensive, large-area ion, electron and X-ray beams, with the guidance of the beam being effected already in the beam generator by means of operationally variable magnetic and electric fields and variable magnetic correction fields.

Such particle and X-ray beams with selectable beam characteristics are required, for example, for processing materials employed in the surface and thin-film technology and for beam induced lithographic processing, e.g. X-ray lithography. Another field of application is the examination of physical processes taking place in highly densified matter formed by intensive radiation at high energy density.

High intensity particle streams can be generated by means of ion diodes which are supplied with energy by powerful current sources which are available in the art. A type of diode is known in which a self-generated $B_\theta$ field is used to magnetically isolate the electrons in the diode gap. Ion currents up to 750 kA have been generated with such socalled $B_\theta$ diodes. You can find a description of a so called $B_\theta$ diode in: K. W. Zieher, Nuclear Instruments and Methods in Physics Research 228 (1984) 161–168.

Other Diodes of a type other than the $B_\theta$ diode are also known which have a comparable ion current yield but which, in their manner of operating, exhibit marked drawbacks compared to the $B_\theta$ type. They lack the clear electrode structure which distinguishes the $B_\theta$ diode and with which the physical processes can be clarified and influenced fairly well. A significant feature of such diodes is the development of nonstationary electrodes which are formed by variable space charge configurations. Thus, it is hardly possible to determine local acceleration and guidance fields or even calculate them. This applies, in particular, for the unstable, so-called virtual cathodes which do not permit clear beam focusing. Additionally, the degree of damage to parts of the diode structure by the free charge carriers of the diode plasma and by currents of free, not metallically bound electrons is so high that the diode is destroyed after a very short period of time (fractions of microseconds). Generally, the representatives of such plasma diode types (pinch diodes, pinch reflex diodes, etc.) survive only one short bombardment pulse. Then they must be regenerated or replaced completely.

Although the time for which a $B_\theta$ diode can be subjected to loads is much higher than for other diode types, the $B_\theta$ diode also requires the exchange of operationally important components after an effective period of operation of a few microseconds and its operation is by no means continuous. The reason for this is the high currents of free electrons which pass through the cathode/anode gap over paths of different lengths and destroy the anode supports they encounter while damaging parts of the anode surface upon impact. Another decisive drawback of all prior art high current diodes, including the $B_\theta$ diode, is that it is impossible to set and optimize the fields which influence the particle beam and which are determined by structure and geometric data. Thus, it is impossible to clearly guide a beam having the desired focusing characteristics.

These described drawbacks, namely the completely insufficient loadability time and the impossibility of a positive, clear beam guidance, make the prior art methods and arrangements unsuitable for industrially usable beam operation.

SUMMARY OF THE INVENTION

It is an object of the present invention to generate a beam of charged particles at high current intensity whose characteristics can be freely determined an adaptation to the technology employed. Thus, it should be possible to set the beam angles (angles formed by the particle path with the beam axis) between strong divergence and strong convergence in dependence on the desire for a large-area beam or a focused beam with minimum beam area and correspondingly high current density. In between lies the state of a parallel beam which is required, for example, for transportation over greater distances if no additional beam guidance elements are to be used outside of the beam generator. No external current sources should be required for the beam guidance disposed within the acceleration range of the beam generator.

The generated particle beam should leave the beam generator in a current neutralized manner. For a proton beam, this means that, within a given time interval, as many electrons as protons are transported in the beam. Only in such a case is the beam magnetically neutral. Thus self-induced interfering magnetic fields are eliminated which could influence the beam in an undesirable manner.

However, free electrons must be suppressed in the beam generator itself. This is necessary for two important reasons. Firstly, a zone should be created in which the azimuthal inherent magnetic field of the ion current is utilized for positively calculatable self-focusing; and secondly, it must be prevented that high, uncontrollable currents of free electrons damage the beam generator and destroy it after a short time while additionally influencing the ion beam in an uncalculatable manner.

Since the current source to operate the beam generator is able to primarily furnish only an electron current which must form a loop through the generator, it is unavoidable that electron currents also occur in the generator which are obligatory to ensure a continuous current throughput. However, these electrons must not appear as free electrons anywhere in the area of the beam generator, i.e. they must be brought through the beam generator as line currents. This requirement, which is fundamental for long-term operation, is not met in any of the prior art diode types.

The direct measurement of the generated free ion current is interfered with by the electrons in the neutralized current. With such a neutralized beam structure, which is necessary for intensive currents, the prior art methods of current determination by measuring the charge impinging on a target, on wires or on Faraday cups, fail since the charge is here measured integrally but not in the elementary act. A current determination by inductive means, e.g. by means of Rogowski coils, would also lead to completely erroneous results. Even the actually not quite accurate method of trace analysis, with the aid of beam sensitive measuring foils with which microscopic elementary reactions can be detected, cannot be used in a direct primary beam since, at the here technologically required high current densities, the foils would be destroyed immediately. The current intensity of the beam should therefore be determined by way of line currents that can be unequivocally measured within the beam generator.

This is generally accomplished by the present invention for a self-focusing beam generator for long-term operation by generating the beam guidance fields in the beam generator by the beam current itself, and generating the desired magnetic correction fields by the current supplied to the beam generator.

Other advantageous modifications and embodiments of the invention, particularly also for a beam generating and beam guidance system with which to implement the method are disclosed.

The invention will be described in greater detail below with reference to embodiments thereof.

BRIEF DESCRIPTION OF THE DRAWINGS

Fig. 1a is a detail view showing the drive for the adjustment of the position of the cathode of FIG. 1.

FIG. 1b is a detail sectional view along the section A-B of FIG. 1.

DETAILED DESCRIPTION OF THE PREFERRED EMBODIMENT

Figure 1:
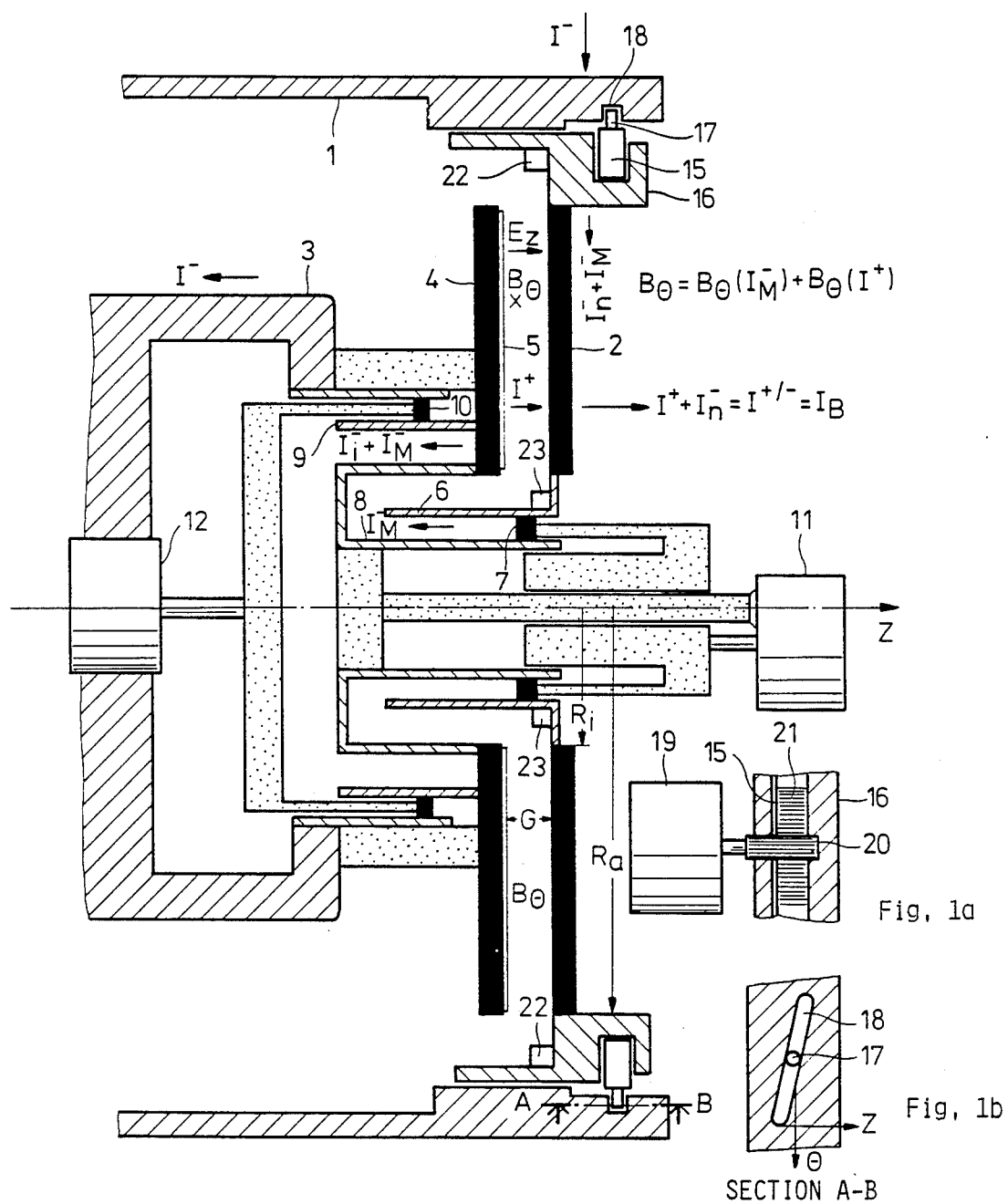
FIG. 1 is a radial sectional view of a self focusing ion diode partial beam generator with the FIGURE being provided with markings for the individual current components and the beam guidance fields for carrying out the present invention.
Figure 3:
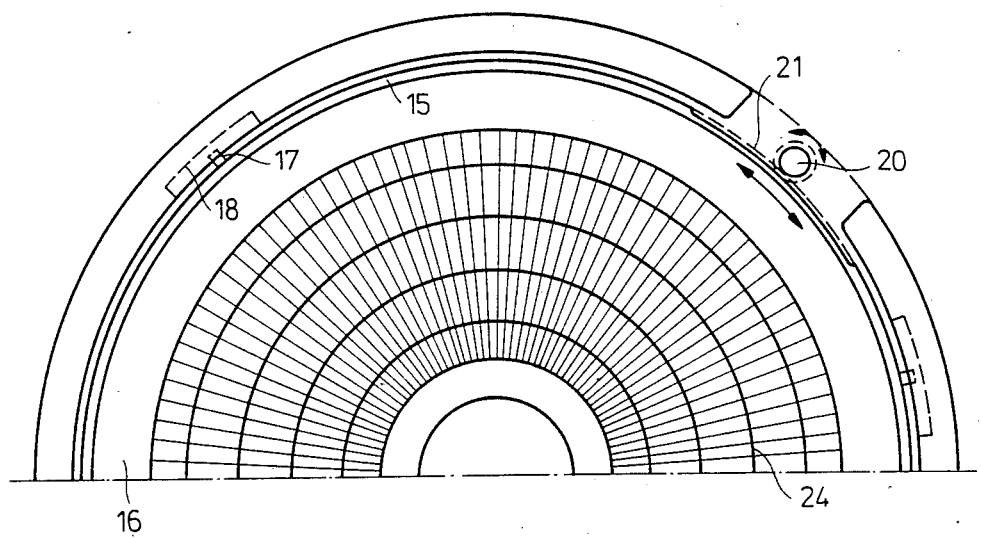
FIG. 3 is a schematic front view of the adjustable cathode of the autofocus ion diode of FIG. 1.

FIG. 1 is a radial sectional view of an autofocus diode for the generating of a particle beam in its position at the end of the coaxial output line of a pulse current supply device (not shown). Also not shown are the remaining known portions of the particle beam system, i.e. certain further control focussing electrodes etc. The electron current $I^-$ supplied by way of an external cylindrical conductor 1 of the coaxial line from the current supply device flows to a cathode 2 of a progressive $B_\theta$ diode and is here shown as split into two components, i.e., a magnetization current component $I_M^-$ and a neutralization current component $I_n^-$ whose significance will be explained below. Cathode 2 is an annular laminar cathode provided with emission rings 24 as shown in FIG. 3. The anode 4 of the diode is electrically connected (in a manner to be described below) with an internal conductor 3 of the coaxial line from the current supply device, and is highly positively biased relative to the cathode 2.

Due to the high field intensity (approximately 50 MV/m) in the gap between the anode 4 and cathode 2, a plasma is generated at the organic surface 5 of the anode 4 which is covered with a plastic material high in hydrogen. From this plasma, the protons are eliminated and accelerated in the gap while the electrons released by ionization during the plasma formation flow off as electron current $I_i^-$ to the positive internal conductor 3. The proton current $I^+$ penetrates laminar cathode 2 (see FIG. 3) and here generates a high space charge potential at the negative laminae with strong peak fields at the edges of the laminae, resulting in the field emission of electrons. The electrons released here neutralize the proton current $I^+$ still in the cathode plane and, together with the proton current, drift as a neutralized total current $I^{+/-} = I^+ + I_n^-$ into the outer space. In their entirety, the field emitted electrons furnish the neutralization current $I_n^-$ which, if the neutralization is complete, must equal the proton current $I^+$.

In the inner region of cathode 2, a negative partial current $I_M^-$ is branched off with the aid of a resistance cylinder 6, is transmitted via a moveable contact ring 7 to an inner conductive tube 8 and fed to the anode 4. From here the current $I_M^-$ flows, together with ionization current $I^i_-$, via a further resistance cylinder 9 and a further moveable contact ring 10, back to the internal conductor 3. Contact rings 7 and 10 can be displaced with the aid of stepping motors 11 and 12 that are controlled by the switching station. It should be noted that the variable resistors or impedances 6, 7, 8, 9 and 10, shown in the drawing are illustrations only and that each may be realized by resistive, capacitive or inductive impedances, or combinations of same, as required.

Figure 2:
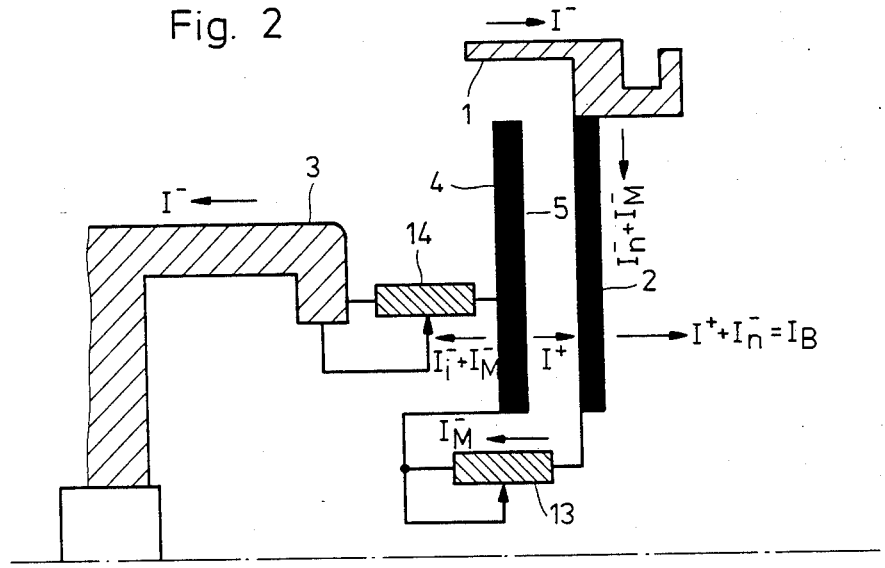
FIG. 2 is a current flow diagram of the control circuits in the autofocusing ion diode of FIG. 1.

The principle of current division is shown once more in FIG. 2. Potentiometer 13 corresponds in its function to regulating members 6, 7, 8, 11 of FIG. 1, and potentiometer 14 corresponds to regulating members 9, 10, 12 of FIG. 1. As can be seen immediately in FIG. 2, potentiometer 14 jointly regulates the proton current $I^+$ and the electron current $I_M^-$, while potentiometer 13 controls the branched-off current $I_M^-$ almost independently of $I^+$. For reasons of maintaining the charge, the following must apply: in its amount, the negative neutralization current $I_n^-$ is equal to the positive proton current $I^+$ which again must correspond in amount to the negative ionization current $I_i^-$, i.e.

$$I_n^- = -I^+ = I_i^-$$

This means that the component $I_n^-$ of the total current $I^-$ furnished by the pulse generator closes in the gap and returns to the generator as electron current $I_i^-$. Together with the other component $I_M^-$, which flows through the diode as a pure line current, there again results the total current $I^-$ in internal conductor 3, thus meeting the requirement for current continuity over the entire system.

This described current distribution and the partial currents that can be set by means of potentiometers 13 and 14 (FIG. 2) are designed, according to the invention, in such a manner that azimuthal magnetic fields are generated in the cathode/anode gap to guide the particle beam $I_B$ in the desired manner; i.e., they determine the beam profile, the beam angle, the focal length and the emittance (beam quality). The protons not yet neutralized in the gap 2/4 are influenced by the following (see FIG. 1):

1. the electrical field $E_z$ which determines the energy;
2. the azimuthal magnetic field $B_\theta(I_M^-)$ generated by the electron current $I_M^-$ flowing through the internal pipe or tube conductors 6/8;
3. the azimuthal magnetic field $B_\theta(I^+)$ generated by proton current $I^+$ itself; and
4. the duration of the influence exerted by these magnetic fields, i.e. the time it takes to travel through the gap at a given acceleration voltage, that is the gap length G.

According to the invention, the gap length, i.e., the distance G between the cathode 2 and the anode 4, can be set during operation. A suitable mechanism for this purpose, as an example for cathode displacement in the z direction, is shown in FIGS. 1, 1a, 1b and 3. A setting ring 15 is fitted into a circumferential groove on the outer surface of the cathode guide tube 16 which is mounted so as to be rotatable about the z axis. A plurality of short, radially extending pins 17 are attached to the outer surface of the setting ring 15 and engage in respective obliquely oriented grooves 18 formed in the inner surface of the external conductor 1 as can be seen in the detail section view of FIG. 1b. Since the guidance provided by grooves 18 includes a z component, rotation of setting ring 15 about the z axis produces a displacement in the z direction of guide tube 16 and a corresponding displacement of cathode 2 carried by guide tube 16. As shown in FIGS. 1a and 3, the drive for this rotary movement is generated by a stepping motor 19 which by way of a pinion 20 engages in peripheral gear teeth 21 disposed on the outer surface of the setting ring 15.

As will be demonstrated by a calculation below, the focal length of the beam generating system of FIG. 1 can be determined by means of the cathode/anode distance G set in the above manner, i.e.—by controlled axial displacement of the cathode 2.

In the area outside of the central line current $I_M^-$, the following applies according to the law of magnetomotive forces for azimuthal magnetic fields generated by the electron current:

$$H(I_M^-) = I_M^- / 2R\pi \qquad (1)$$

The magnetic field $H(I^+)$ generated by the free ion current $I^+$ is obtained as follows, with the assumption of a homogeneous source density $i^+$ over the anode surface, from the first Maxwell equation for any desired radius R in the gap volume, $R_i \leq R \leq R_a$:

$$H(I^+) = (i^+/2)[(R^2 - R_i^2)/R] \qquad (2)$$

where $R_a$ is the outer radius of the cathode and $R_i$ is the inner radius of the cathode.

If one now introduces the total ion current $I^+$, which can be determined from the measurement, the resulting magnetic induction in the gap G is the following:

$$B_\theta = \frac{\mu\mu_o}{2\pi R} \left[ \frac{(R^2 - R_i^2)I^+}{R_a^2 - R_i^2} + I_M^- \right] R_i \leq R \leq R_a \qquad (3)$$

Figure 4:
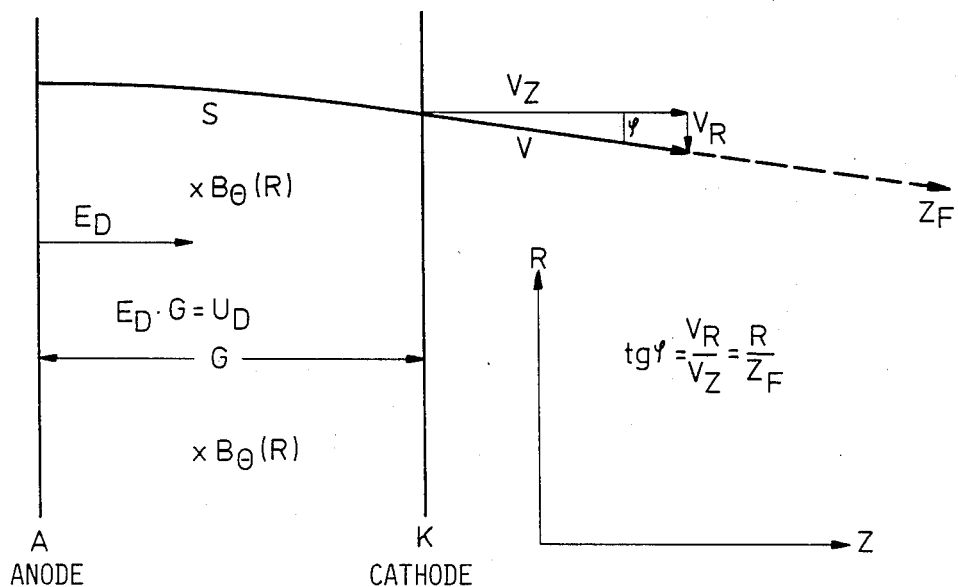
FIG. 4 illustrates the derivation of the particle path in the beam generator of FIG. 1.

At the given diameter ratio $R_i/R_a$, currents $I^+$ and $I_M^-$ must now be selected so that $B_\theta$ coincides with the desired magnetic field $B_\theta$ required to obtain the desired beam characteristics. This guide field required for the geometrically simplest, planar diode will now be determined with the aid of FIG. 4. It is assumed that the acceleration voltage $U_D$ and the gap length G are given. Then, the velocity $v_z$ for an ion starting at anode A is $$v_z = b_E \cdot t$$

The azimuthal field $B_\theta$ deflects the ion radially inwardly at a velocity $$v_R = \frac{U_D \cdot e^2 \cdot B_\theta}{G \cdot m^2} t^2$$

Thus the azimuthal desired field $B_{\theta S}$ becomes $$B_{\theta S} = \frac{R}{Z_F \cdot G} \sqrt{\frac{m \cdot U_D}{2e}} \qquad (5)$$

Equation (3) indicates which magnetic field $B_\theta$ is generated for radius R by currents $I^+$ and $I_M^-$ at given diode dimensions $R_i$ and $R_a$. Equation (5) determines which desired field $B_{\theta S}$ is required at radius R for the given operational data and the desired focal length $Z_F$. The problem to be solved is now to select the current ratio $I^+/I_M^-$ in such a way and to set the current values in such a manner that over the entire beam area the magnetic fields generated by $I^+/I_M^-$ coincide with the desired field, i.e. that the following applies regardless of variations in the radius:

$$B_\theta(I^+/I_M^-) = B_{\theta S} \qquad (6)$$

Using Equations (3), (5) and (6), there then results the following statement:

$$B_\theta = \frac{R}{Z_F \cdot G} \sqrt{\frac{m \cdot U_D}{2e}} = \qquad (7)$$

$$\frac{\mu\mu_o}{2\pi R} \left[ \frac{(R^2 - R_i^2)I^+}{R_a^2 - R_i^2} + I_M^- \right]$$

where
$Z_F$ = the focal length
R = the radius of the source point on the anode
m = the mass of the ion
$U_D$ = the acceleration voltage at the gap G
G = the distance between the cathode and the anode (gap length)
$R_i/R_a$ = inner/outer diameter ratio of the anode
$I^+$ = the total ion current
$I_M^{31}$ = the electron line current
$\mu_o$, $\mu$ = the absolute and the relative permeability.

The current ratio is set to be constant, a requirement which results in any case in operational practice. A relationship is obtained for the ion current $I^+$ which meets the requirement of coincidence of the fields for every radius according to Equation (6):

$$I^+ = \frac{K_1}{K_2}(R_a^2 - R_i^2) \tag{8}$$

with the following abbreviations:

$$K_1 = \frac{1}{Z_F \cdot G}\sqrt{\frac{mU_D}{2e}}; \quad K_2 = \frac{\mu\mu_o}{2\pi}; \quad \lambda = \frac{R_a^2 - R_i^2}{R_i^2}$$

This provides the absolute value of the ion current $I^+$. The absolute value of the electron line current $_M^-$ results from the following:

$$I_M^- = \frac{I^+}{\lambda} = I^+ \frac{R_i^2}{R_a^2 - R_i^2} \tag{9}$$

and thus the following complete equation results for the ion current $I^+$:

$$I^+ = \frac{1}{Z_F \cdot G}\sqrt{\frac{m \cdot U_D}{2e}} \cdot \frac{2 \cdot \pi}{\mu\mu_o}(R_a^2 - R_i^2) \tag{10}$$

Thus, the ion current can be calculated for a given geometry and a desired focus.

Figure 5:
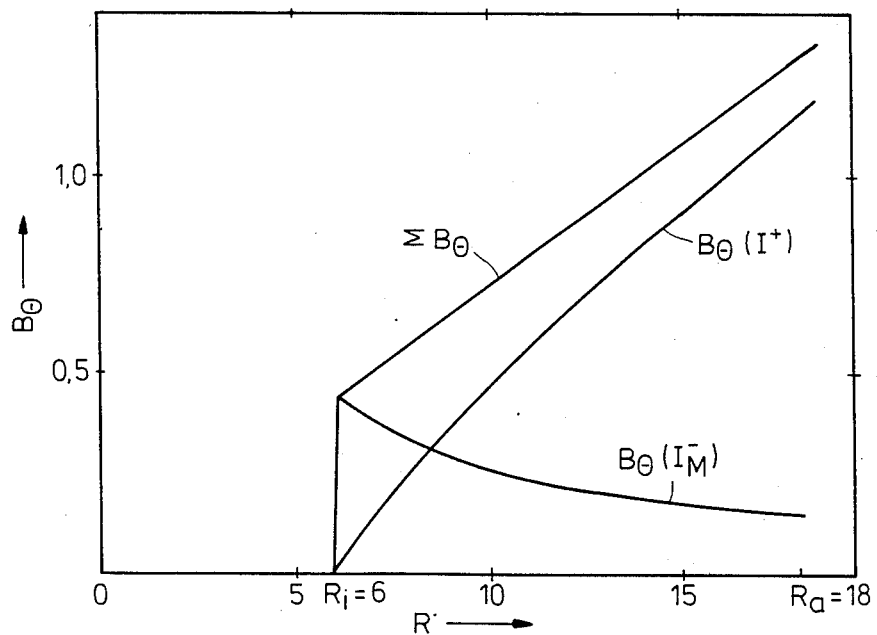
FIG. 5 shows the magnetic beam guidance fields in the acceleration gap of the beam generator of FIG. 1.

FIG. 5 shows curves for the partial magnetic fields $B_\theta(I^+)$ and $B_\theta(I_M^-)$ and the effective sum field $\Sigma B_\theta$ for an example involving the following data:

$R_a = 18$ cm, $R_i = 6$ cm, $G = 2$ cm, $Z_F = 0.5$ cm, $U_D = 10^6$ V

From the above derived relationships, the following then results:

$I^+ = 1.04 \cdot 10^6$ A
$\lambda = I^+/I_n^- = 8$
$I_M^- = I^+/\lambda = 1.30 \cdot 10^5$ A The radial curve of $B_\theta(R)$ results from Equation (5) and correspondingly from Equation (3) with the calculated values for $I^+$ and $I_M^-$. The limit values for $B_\theta$ at the inner and outer radius are as follows:

$B_\theta(R_i) = 0.434$ Tesla: $B_\theta(R_a) = 1.3$ Tesla.

Between these limit values, the sum field is linear with R as is required for the desired field according to Equation (5).

The gap length G is without influence on the magnetic field generated by currents $I^+$ and $I_M^-$, as demonstrated by Equation (3). In the desired magnetic field, the curve linear with R remains unchanged if G changes. The value of G influences only the steepness or slope of the magnetization curve (FIG. 5). If the product $Z_F \cdot G$ is constant in Equation (5), focusing is ensured at the given operational data. Currents $I^+$ and $I_M^-$ do not change as demonstrated by Equations (9) and (10). Consequently, a shortening of the gap length G and a corresponding reduction of the gap voltage $U_D$ is a way to reduce the beam power and thus also the power output requirement for the current supply device. The charge carrier emission on the anode 4 is determined by the electric field intensity.

$$E_Z = U_D/G$$

and it remains constant with quotient $U_D/G$ as predetermined. However, the particle energy $$W = G \cdot E_Z \cdot e = U_D \cdot e$$

may be kept as small as possible by means of gap length G at a high beam current density, which may be of great significance for many fields of application, for example for the thin-film technology and for lithographiic processes.

Thus, in summary, one starts with a beam generator of the diode type with the simplest possible, clearly understood geometry, namely a planar, plane parallel cathode-anode system as shown in FIG. 1. According to the present invention, the currents for the magnetic fields determining the beam profile and the focal length are measured directly, i.e. the total electron current $I^-$ is measured by means of a Rogowski coil 22 disposed adjacent the guide tube 16 and the magnetization current $I_M^-$ is measured by means of a Rogowski coil 23 disposed adjacent the resistance cylinder 6.

To determine and align the ion current $I^+$ and the current ratio $\lambda = I^+/I_M^-$ determinative for focusing, the already discussed simple relationship for the values of the current is employed, i.e. the following:

$$I^- = I^+ + I_M^-, I^+ = I^- - I_M^-$$

$$(I^-/I_M^-) = (I^+/I_M^-) + 1 = \frac{R_a^2 - R_i^2}{R_i^2} + 1 = \lambda + 1$$

In the example on which FIG. 5 is based, where $R_a^- = 18$ cm and $R_i = 6$ cm, a desired value of 9 results for the ratio of the directly measurable currents $I_M^-$ and $I^-$. If the actually measured value is different, the current ratio can be set back to the desired value, i.e., 9 in the present example, by means of potentiometer 13 of FIG. 2 (regulating members 6, 7, 8, 11 of FIG. 1).

The actually existing ion current, from the measured currents $I^-$ and $I_M{}^{31}$, results, according to Equation (20), as follows:

$$I^+ = I^- - I_M^-$$

If this value differs from the desired value defined by Equation (10), $I^+$ can now be re-adjusted to the desired value (10) by means of potentiometer 14 of FIG. 2 (regulating members 9, 10, 12 of FIG. 1). However, it is also possible to adjust the diode by means of a technologically possible to adjust the diode by means of a technologically optimum current which, however, is initially incompatible with the beam guidance. The requirements for the magnetic guidance field resulting from the desired focal length $Z_F$ can then be met by setting the gap length G. This becomes clear upon consideration of Equations (3) and (5). For the stated purpose, the magnetic field $B_\theta$ obtained from Equation (3) by means of the technologically required desired ion current $I^+$ is inserted into Equation (5), and solved for G, as follows:

$$G = (R/Z_F \cdot B_\theta)\sqrt{m \cdot U_D/2e} \tag{11}$$

According to the present invention, the gap width G resulting at the desired focal length $Z_F$ can now be set at the diode by means of stepping motor 19 and its associated drive 20, 21 (FIGS. 1, 1a, 1b and 3). The current ratio $I^+/I_M^-$ set once according to the invention is not interfered with by this gap regulation since, according to Equation (9), this current ratio depends only on the anode radius and is thus invariable relative to the values G, $U_D$, $I^+$ and $B_\theta$.

For the ratio of the radii $(R_a/R_i) = C$ and the current ratio $(I^+/I_m^-) = \lambda$, the following simple relationship applies:

$$\lambda \overset{(9)}{=} \frac{R_a^2 - R_i^2}{R_i^2} = \frac{R_i^2\left[\frac{R_a^2}{R_i^2} - 1\right]}{R_i^2} = C^2 - 1 \quad (12)$$

The configuration of a simple, plane parallel diode with conventional geometric values can now be obtained in a comfortable manner from the following table which is derived from Equation (12):

| $C = (R_a/R_i)$ | 1 | 2 | 3 | 4 | 5 | 6 | 7 |
|---|---|---|---|---|---|---|---|
| $\lambda = C^2 - 1$ | 0 | 3 | 8 | 15 | 24 | 35 | 48 |
| $\Delta\lambda = \lambda_i - \lambda_{i-r}$ | | 3 | 5 | 7 | 9 | 11 | 13 |

Of course, Equation (12) also applies for any fractional values of $R_a$, $R_i$ and C.

Electrons starting from the cathode 2 and accelerated by the electrical field $E_Z$ in the direction of the anode 4 are deflected radially inwardly after a few millimeters in the gap, which is initially assumed to be without current, by the azimuthal magnetic field $B_\theta$ and are prevented from directly passing to the anode 4 (FIG. 1). This effect of electron isolation by the magnetic field is reinforced by the space charge forces emanating from the ion current. According to the present invention, the electrons leaving from cathode rings 24 in FIG. 3 are immediately gripped by the electrical space charge field which is parallel to the direction of magnetic forces, are washed into the ion current and carried away by it which causes the charge of the ion current to be neutralized. This interaction of the azimuthal magnetic field with the electrically positive space charge field of the ion current prevents the electrons from penetrating into the cathode-anode area.

In the diode arrangement according to the present invention, the free electrons, which are present in prior art diode types (so-called $B_\theta$ diodes, pinch reflex diodes and others) and which emanate from other structural regions and close the circuit through the prior art diode, are suppressed in that the electron current is conducted through the diode as a bound line current i.e., through a conductive circuit path. The uncontrolled expansion of free electrons by their own repelling space charge forces is thus prevented. This expansion of the current is very damaging since structural components of the diode are hit by high energy electrons and are destroyed after a short period of time. This is one of the reasons why few prior art diode types survive even a single bombardment.

Figure 6:
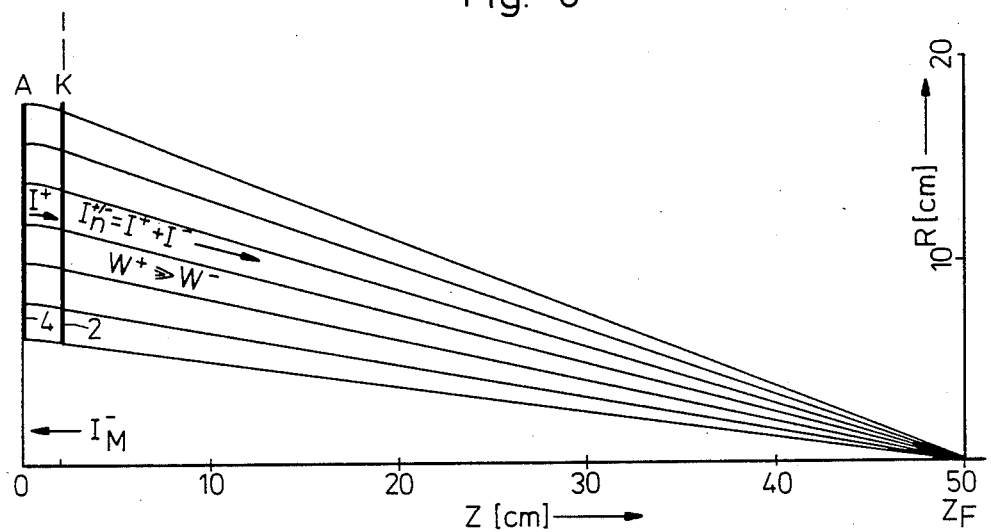
FIG. 6 schematically illustrates the profile of the self-focusing beam which has been neutralized after leaving the diode of FIG. 1.

The beam curve of a diode without external beam guiding elements is shown to scale in FIG. 6 for electrode dimensions $R_i = 6$ cm, $R_a = 18$ cm and the operating data of the calculated example on which the field lines of FIG. 5 are based. The focusing range is concentrated according to the invention and sharply limited in the clearly defined gap between the anode A and the cathode K. The proton beam $I^+$ which leaves the diode as a charge compensated beam $I_n^{+/-}$ is neutralized in the laminar ring cathode. Since the two components, the proton beam $I^+$ and the electron beam $I_n^{31}$ (see FIG. 1), generate oppositely polarized azimuthal magnetic fields, the resulting magnetic field also disappears so that the beam formed in the diode is retained geometrically in the drift area which is free of electric and magnetic fields. Without charge compensation, the ion beam would be expanded similar to an explosion.

Field intensities in an order of magnitude of MV/cm occur between the cathode laminae and the positive charges of a 500 KA ion beam and initiate a charge compensating field emission of electrons. This mechanism is actuated by the experimentally determined beam neutralization and beam retention.

The beams converging at focal point $Z_F$ in FIG. 6 may be considered to be radius beams which emanate orthogonally from a virtual, spherical surface. In the geometrically given, oppositely spherical curvature of the anode/cathode gap of FIG. 7, the geometrically required divergence angle of the beam is just compensated by the azimuthal magnetic field if the operating data coincide with those of FIG. 6. With this combination of geometry and magnetic fields, a parallel beam can be formed which is suitable for transportation over great distances. By varying the operating data and/or the curvature of the gap system, the beam angle can be set over a wide range between a short focal length $Z_F$ and a strong divergence.

Figure 8:
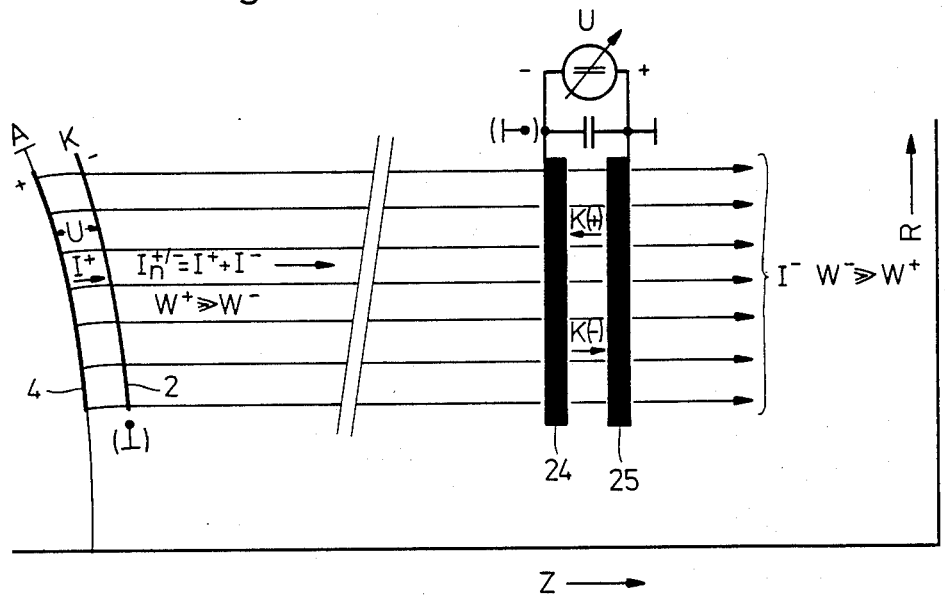
FIG. 8 schematically shows the subsequent separation of the electron current from the neutralized beam of a beam generator according to the invention by retardation of the ions.

FIG. 8 shows an electrode arrangement with which the neutralizing electrons, which drift along with the ions, can be separated to form a separate electron current. In the present, exemplary arrangement, this charge separation operates as follows.

Figure 7:
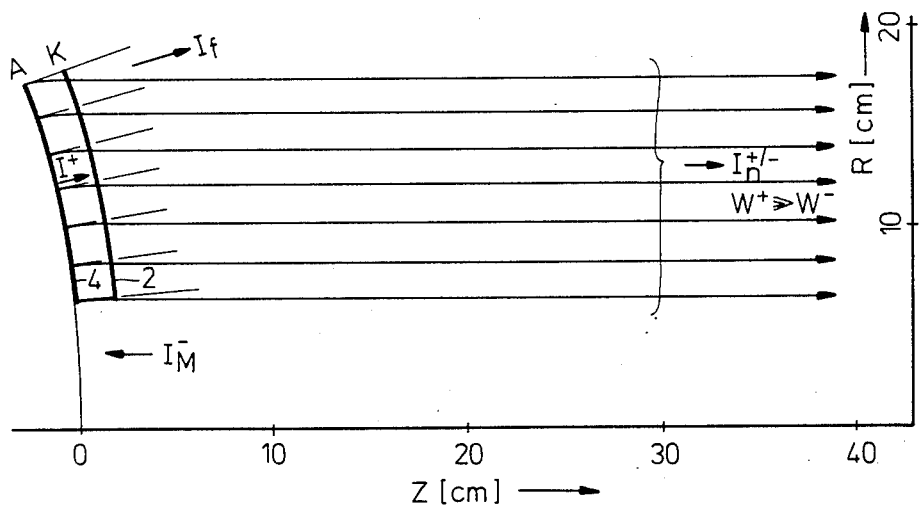
FIG. 7 schematically shows the formation of a beam by the interaction of geometrical divergence with self-magnetic convergence using a beam generator as generally shown in FIG. 1.

A neutralized parallel beam $I_n^{+/-} = I^+ + I^-$ is generated by means of a diode having a curved gap as shown in FIG. 7. With the same drifting velocity, the electron energy $W^-$ is smaller by the mass ratio $m^-/m^+$ than the ion energy, i.e.

$$W^- = \frac{m^-}{m^+} W^+$$

Thus, for 1 MeV protons and $m^-/m^+ = 1/1837$, the electron energy is only 544 eV.

A voltage U is present across electrodes 24 and 25 which are configured similarly to the lamellar cathode of the diode. If now, in tune with the feeding generator, the anode A in the diode is connected to ground, the path from cathode 2 to the electrode 24, in the illustrated polarization, is free of fields if the same voltage is present across electrodes 24–25 and across the diode. In the gap between electrodes 24–25, the ions are stopped (force $K(+)$) and the electrons are accelerated (force $K(-)$). As long as the ions still move in the same direction, the total current $I^{+/-}$ remains current neutralized and thus it behaves magnetically neutral. Therefore the electrons are not isolated in the gap between electrodes 24 and 25 as they are in the anode/cathode gap of the diode. If the voltage across the electrode gap 24/25 is kept somewhat lower than that across the acceleration gap 4/2, the ions are able to overcome the retarding field and are able to continue to drift along with the accelerated electrons. Since, for reasons of continuity, the current intensities of both partial currents must remain constant and identical, the total current remains current neutralized even after it leaves the electrode gap 24/25. In this case, electrode 25 must be raised relative to ground by the difference voltage $$\Delta U = U(4/2) - U(24/25)$$

so as to keep the path 2/24 free of fields.

The described situation of electron current $I^-$ can be performed analogously if cathode 2 and electrode 24 are connected to ground ($\perp$) and anode 4 and electrode 25 are placed "high". Then the electron target (not shown) can be positively biased to keep the external drift path free of fields.

If a pure electron current is required, the ion current can be stopped completely by raising the electrode gap voltage. Another possibility for freeing the electron current of the ions, is a retarding foil (not shown in FIG. 8) which is inserted into the electrode gap at a suitable location. Due to the much shorter range of the protons compared to electrons, the retarding foil can be kept relatively thin so that it constitutes practically no obstacle for the electrons.

The above description was based on a parallel beam as the primary beam. In principle, this electron separation method can be employed for any beam geometry adapted to the problem to be solved. In the embodiment according to FIG. 8, the radiation converter is a large-area "electron shower".

Figure 9:
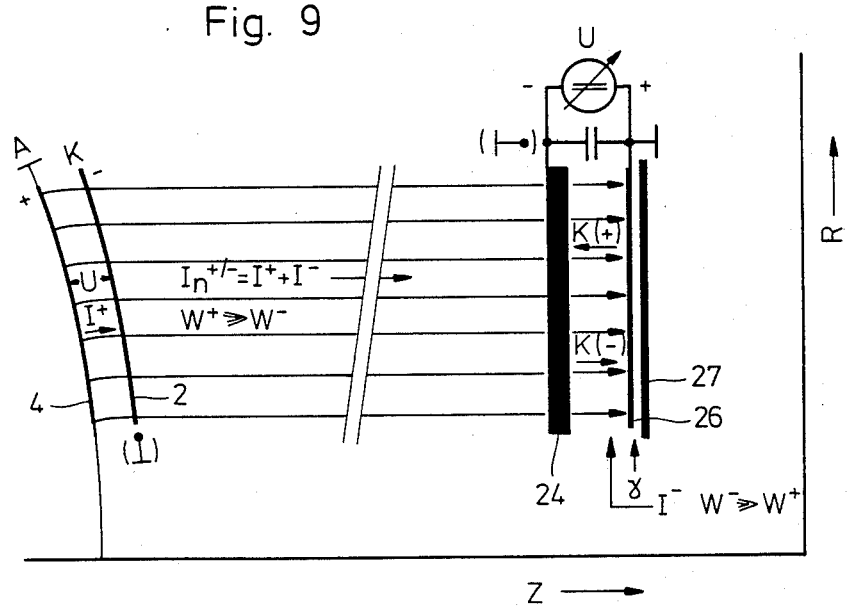
FIG. 9 schematically shows a system for generating X-ray bremsstrahlung from a beam formed according to the invention.
Figure 9A:
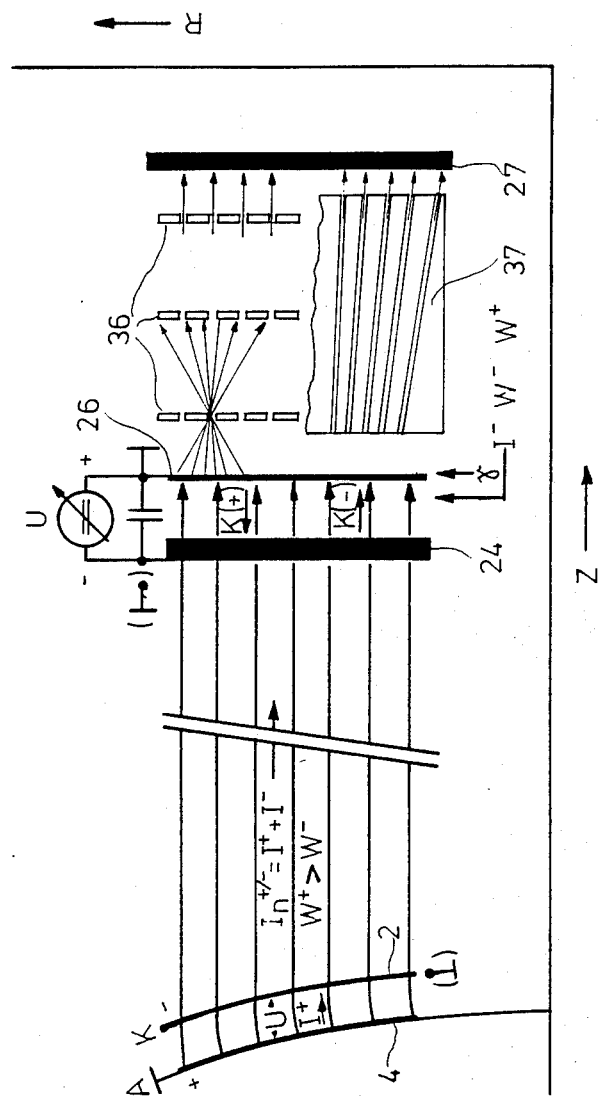
FIG. 9a schematically shows a collimator arrangement for the X-ray bremsstrahlung.

The arrangement of FIG. 9 includes a converter for generating a large-area X-ray beam. Initially, the electron beam is separated according to the method described in connection with FIG. 8. However, instead of a laminar electrode 25, the present invention provides for the use of a baffle plate 26 which serves as the "anti-cathode" and is made of a suitable material, e.g. tungsten. At this baffle plate 26, the electrons impinging with high energy, generate a bremsstrahlung having the known, broad energy spectrum whose maximum energy corresponds to the primary electron energy. This broad X-ray beam, which fills the primary beam cross section, can now be utilized, for example, for surface technology and X-ray lithography. For example, beam masks may be introduced downstream of the anti-cathode 26 operating as the X-ray source to thus cover, according to the respectively given pattern, parts of the surface on the subsequent object being irradiated. In conjunction with a specific chemical etching process, it is possible to produce in this way surface structures as carriers for various semiconductor and metal layers, a method which is of great significance in the art for the production of electronic components, such as circuit boards, integrated circuits, chips, etc.

If parallel X-rays or beams having a given angle to the major axis are required, collimator plates 36 set at a distance can be employed to cut out defined partial beams, with the sharpness of such plates being determined by the ratio of the plate opening to the plate distance. For particularly stringent requirements, it is possible to provide for protection against overlapping of the partial beams, i.e. against, "organization errors", by providing one or possibly a plurality of intermediate collimator plates 36 or axially extending connecting channels 37. Such connecting channels can be produced, for example, by means of micro-honeycomb structures extending in the axial direction of an elongate collimator. By giving the voltage U across gap 24/26, the energy of the X-ray radiation can be set to adapt it to the object to be irradiated. In FIG. 9, the principle of the object to be irradiated is symbolized by a plate 27 which is charged by the X-rays. The neutralization and isolation in electrode gap 24/26 takes place in the same manner as described in connection with FIG. 8. The same applies for the exchangeability of the ground connection $\perp/(\perp)$.

The X-ray spectrum generated by neutralization electrons that have been post-accelerated according to the present invention begins practically at zero and furnishes as its maximum value the energy developed by the electrons after passing through the electron gap 24/26. The desired X-ray energy can thus be set by means of the electron gap voltage in a range from ultrasoft (eV range) to very hard X-ray radiation (MeV range).

If, according to the particular problem to be solved, monoenergetic X-rays are required, this can be accomplished by the selection of a suitable material as the anti-cathode. If tungsten is employed, for example, the continuous radiation is superposed by two intensive lines of 59 and 67 KeV, namely the characteristic radiation of the $K_\alpha$ and the $K_\beta$ transitions. Suitable characteristic X-ray radiation should be available for all practical applications from among the multitude of known X-ray spectra.

Figure 10:
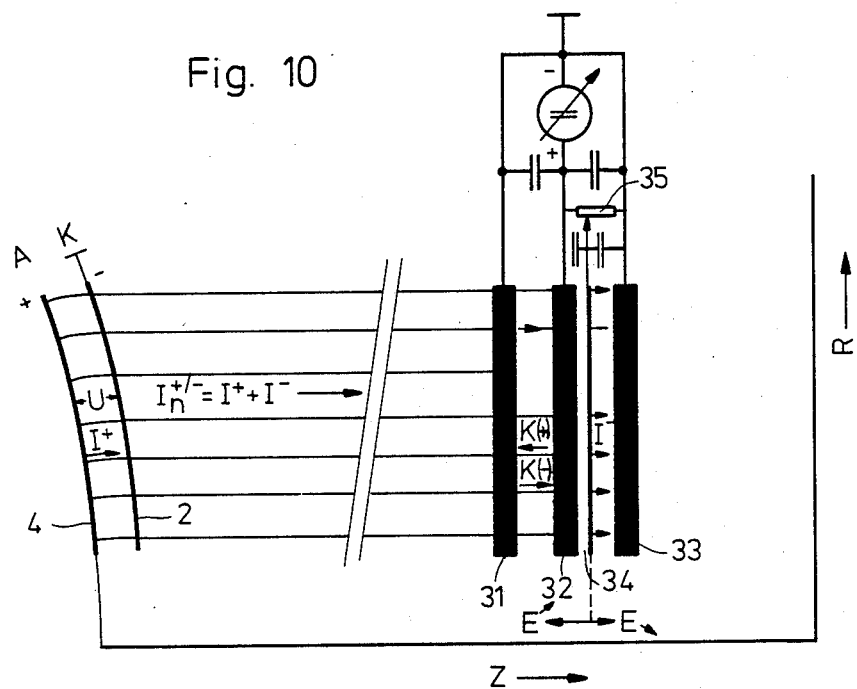
FIG. 10 schematically shows a pendulum radiation converter acting as a X-ray bremsstrahlungs source.

In the arrangement of FIG. 10, the radiation converter according to FIG. 9, by the addition of a third laminar electrode to provide a field between the electrodes 32 and the outer electrode 33 which is of opposite polarity to the field between the center electrode 32 and the outer electrode 31, to form an electron pendulum shower. This electrode triplet 31, 32, 33, as specified by the present invention, operates according to the following principle.

The intensive, neutralized beam $I_n^{+/-}$ which, in the present example, has been selected to be a parallel beam is initially split, as in the arrangements according to FIGS. 8 and 9, in a retarding field disposed between laminar electrodes 31 and 32, into electrons and positive ions. In the subsequent field of reverse polarity, the accelerated electrons are retarded again in electron gap 32/33 and after their reversal, are accelerated in the opposite direction. Thus, the electrons are reflected. Upon return to electron gap 31/32, the same reflection process takes place, and so on. Thus in this electrode triplet 31/32/33, the electrons perform a high frequency pendulum movement. With electrode gap lengths of 1 cm, and a gap voltage of 1 MV, the pendulum frequency is about 5 GHz.

A thin disc 34 operating as an anti-cathode is now introduced into this oscillating electron shower. Depending on its thickness, this anti-cathode disc 34 is now penetrated by the electrons several times, with bremsstrahlung of the material specific characteristic X-ray radiation being generated during each passage. The oscillating electrons are retarded in this way until their energy is spent. The average energy of the X-ray spectrum can be selected to meet the problem at hand by way of the position of the anticathode 34 in the electrode gap 32/34 and the potential set by means of potentiometer 35.

The frequency of the characteristic radiation, however, is independent of the position of the anti-cathode 34. Only if the electron energy falls below the energy of a characteristic line, will this line be extinguished. Due to the use of very thin anti-cathodes, the rate of inherent absorption of the X-ray radiation in the target is extremely low. Secondary reactions, such as a photo effect, a Compton effect and pair formation are almost eliminated so that the X-ray radiation is able to exit in the theoretically determinable direction practically without scattering. This results in a significantly higher efficiency of this pendulum radiation converter compared to that of prior art X-ray sources.

Compared to the light electrons which oscillate at a high frequency, the several thousand times heavier ions are practically "marking time" between the electrodes. After being retarded in electrode gap 31/32, the ions are caught in the anti-cathode 34 already on their first approach and are here recombined with the electrons that have finished oscillating. The resulting magnetic field of the incoherently oscillating electrons is zero. Thus, there no longer exist prerequisites for electron isolation which would interfere with electron movement.

Figure 11:
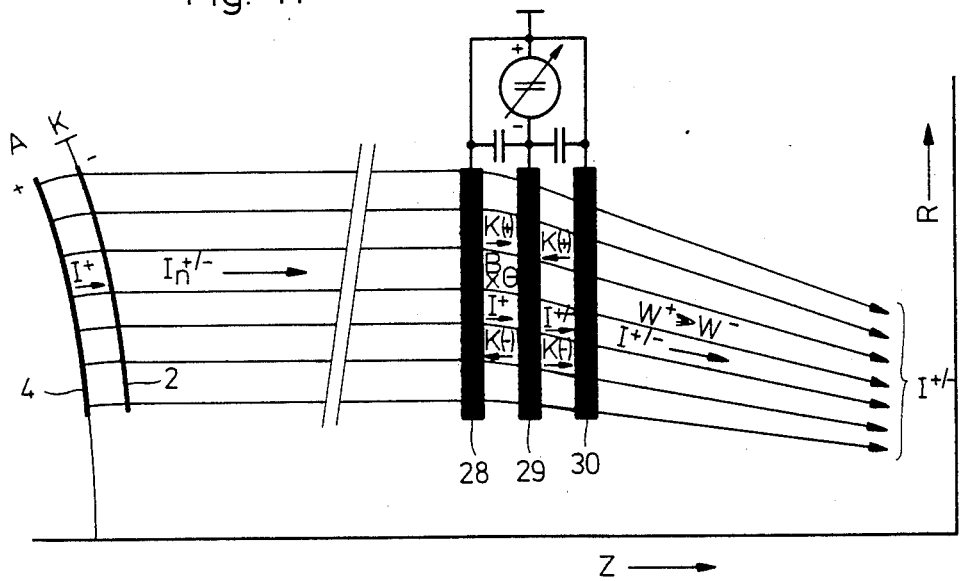
FIG. 11 schematically shows the triple electron lens for focusing the ion current.

An electrode triplet as shown in FIG. 11 for the example of a parallel primary beam serves to focus a neutralized ion beam. In this triplet with the voltage source connected as shown, i.e. with the center electrode 29 being negative relative to the outer electrodes 28 and 30 (the reverse of that for triplet 31–33 of FIG. 10), the electric field in the gap between laminar electrodes 28 and 29 separates the low energy neutralization electrons from the ions. The electrons are stopped by force K(−) and the ions are accelerated by force K(+). The beam, which is now no longer neutralized, is magnetically active and the beaminherent azimuthal magnetic field $B_\theta$ focuses the beam as this also occurs in the diode itself. The beam is neutralized again in laminar electrode 29, again according to the cathode neutralization curve in the diode as described in connection with FIG. 1.

In the subsequent electrode gap 29/30, beam $I^{+/-}$ is neutralized again and thus magnetically inactive and remains geometrically conserved. This also applies for the subsequent drift path of the focused beam. To realize a special, desired beam geometry, the magnetic beam formation in electrode gap 28/29 can be influenced, according to the invention, by a suitable geometric configuration of electrode gap 28/29 (see FIG. 7). The drift paths upstream and downstream of the focusing triplet 28–30 are free of fields if, as in the embodiment of FIG. 11, external electrodes 28 and 30 are connected to ground.

Analogously to the operation of a convergent lens, a parallel beam can also be formed by means of the electrode triplet if it is used in the diverging beam downstream of a beam constriction. In principle, it is possible to produce, in conjunction with geometric corrections, any desired beam shape from a convergent, divergent or axially parallel beam.

The present disclosure relates to the subject matter disclosed in Federal Republic of Germany patent Application P No. 38 06 079.5 of Federal Republic of Germany, the entire specification of which is incorporated herein by reference.

The invention now being fully described, it will be apparent to one of ordinary skill in the art that any changes and modifications can be made thereto without departing from the spirit or scope of the invention as set forth herein.

What is claimed:

1. In a method for the repeatable generation and guidance of an intensive, large-area charged particle beam, including: applying a pulsed current from a current source to an ion diode particle beam generator, and effecting the beam guidance in the beam generator by means of operationally variable, magnetic and electric fields; the improvement comprising: providing a self-focussing diode beam generator; generating the beam guidance fields in the beam generator by the beam current itself; and generating the desired magnetic correction fields by the current supplied to the beam generator.

2. A method as defined in claim 1, wherein said beam guidance fields and said correction fields locally cooperate such that the resulting guide field configuration develops in an acceleration region between an anode and a cathode of the beam generator in a sharply limited manner and influences the beam in a defined manner only in this region.

3. A method as defined in claim 2, further comprising maintaining said region of beam acceleration and beam guidance within the beam generator free of free electrons.

4. A method as defined in claim 3, wherein said step of maintaining includes providing a conductive connection between the anode and cathode of the ion diode beam generator, whereby said current supplied to said generator is a bound line current; and wherein said step of generating the magnetic correction fields includes adjusting said bound line current to set a desired magnetic correction field.

5. A method as defined in claim 4, comprising adjusting said currents so that the generated beam is neutralized immediately after passing through the clearly defined acceleration and beam guidance region, and thus remains uninfluenced by inherent fields on its further path.

6. A method as defined in claim 5, further comprising: positively setting the guide and correction fields to focus the generated beam; and thereafter, operationally changing at least one geometric parameter of the beam generator to set a freely selectable desired focal length for the generated beam.

7. A method as defined in claim 5, wherein the diode has fixed geometric parameters; and further comprising setting the guide and correction fields to provide a freely selected focal length for the generated beam.

8. A method as defined in claim 5, further comprising providing a configuration of the acceleration region of the beam generator such that the interaction of the guide and correction fields with said configuration permits the free selection of the beam characteristics within limits ranging from strong convergence to strong divergence, including the special case of the parallel beam.

9. A method as defined in claim 8, further comprising determining the intensity of the generated beam of charged particles by measuring clearly measurable line currents, independently of the degree of neutralization and free of interfering influences from charged particles of a polarity other than the polarity to be measured.

10. A method as defined in claim 9, further comprising providing the cathode of the diode with emission rings from which, under the influence of an azimuthal magnetic field $B_\theta$, electrons exit unimpededly radially toward the center of the diode.

11. A method as defined in claim 10, wherein the radially deflected electrons are immediately caught by electrical space charge forces acting in the same direction in the ion current $I^+$ flowing through the cathode, and are washed into the ion current $I^+$ for current neutralization, whereby the radially deflected electrons are prevented from penetrating into the cathode-anode space of the diode and from building up a virtual cathode which would change the diode geometry.

12. A method as defined in claim 11, wherein said step of adjusting the bound line current to set a desired magnetic correction field includes providing a variable impedance in the conductive path between the anode and cathode of the diode, whereby a magnetization current $I_M^-$ is branched off from the diode current $I^-$, as a bound line current; and regulating the variable impedance during operation to set the magnetization current to a desired value.

13. A method as defined in claim 12, further comprising setting the principal magnetic field generated by the beam current $I^+$ by regulating the bound line ionization line current $I_i^-$ returning to the current source during operation by means of a variable impedance connected in the return current line to the current source.

14. A method as defined in claim 6, wherein said geometric parameter is the gap length between the anode and cathode of the diode; and further comprising mounting the cathode in a guide tube which is axially displaceable during operation by way of a setting ring which engages in oblique grooves, and which is rotatable about the major axis of the beam generator; and setting the gap length to a desired value by axially displacing the cathode relative to the anode.

15. A method as defined in claims 13, further comprising providing the self-focussing diode with a geometric configuration such that, with a given ratio of the outer diameter $R_a$ to the inner diameter $R_i$ of the annular anode and cathode electrodes and a fixed ratio of ion current $I^+$ to magnetization current $I_M^-$, which ratio is adjustable during operation, partial ion beams from any desired source point of the anode intersect the beam axis at the same point.

16. A method as defined in claim 15, comprising generating a parallel beam by the interaction of given magnetic guide fields having geometric features which cancel out the effect of the given fields.

17. A method as defined in claim 15, comprising producing beam geometries between a short focal length and strong divergence by the interaction of given magnetic guide fields having geometric features which are directed more or less respectively against the effect of the given fields.

18. A method as defined in claim 15, further comprising generating large-area electron currents $I^-$ of a desired beam geometry by separating the electrons from the supply of neutralization electrons in the beam produced by the generator by providing suitable retarding an acceleration fields in the beam path.

19. A method as defined in claim 18, further comprising placing thin absorber discs in the beam path to stop ions that drift along with said electrons to produce a pure electron beam $I^-$.

20. A method as defined in claim 18, further comprising generating a large area X-ray bremsstrahlung by inserting a baffle plate in the electron beam path to serve as an anticathode.

21. A method as defined in claim 18, further comprising inserting a suitable package composed of an anticathode, a beam mask and an object to be irradiated into the electron beam path for implementating radiation induced surface technologies.

22. A method as defined in claim 20, further comprising producing large-area, parallel X-rays or X-rays having a defined beam angle by placing collimator plates provided with suitable hole structures in the electron beam $I^-$ at distances corresponding to the desired resolution.

23. A method as defined in claim 18, further comprising avoiding overlaps and errors in organization of the beam by inserting groups of thin connecting channels in the electron beam $I^-$.

24. A method as defined in claim 20, further comprising determining the hardness of the X-ray bremsstrahlung spectrum by setting an acceleration voltage across a separation gap of electrodes disposed in the beam path to provide said acceleration field.

25. A method as defined in claim 24, further comprising generating large-area characteristic X-ray radiation of a desired frequency by inserting anti-cathode discs of a suitable material in the electron beam path.

26. A method as defined in claim 18, further comprising generating a high frequency electron pendulum shower by reflecting the post-accelerated electrons leaving said acceleration field in a retarding electric field.

27. A method as defined in claim 26, further comprising generating a large-area, intensive X-ray beam by inserting an anti-cathode disc in said electron pendulum shower.

28. A method as defined in claim 27, further comprising improving the efficiency of the X-ray beam source by the use of very thin anti-cathode discs, whereby scattering and inherent absorption are practically avoided in the x-ray beam source.

29. A method as defined in claim 18, further comprising focussing the particle beam produced by the beam generator by inserting an electrode triplet as a focussing lens in the beam path with the electrode triplet causing, in a first step, the electrons of the neutralized beam $I_n^{+/-}$ to be stopped and the extracted ion current $I^+$ to be focused in the inherent magnetic field and, in a second step, the ion current $I^+$ to again be neutralized to become $I^{+/-}$, and thus geometrically conserved again.

30. A method as defined in claim 29, wherein a desired beam geometry is produced by the interaction of the inherent magnetic field with the geometric features of the electrode triplet.

* * * * *